United States Patent [19]

Langford et al.

[11] 4,320,446
[45] Mar. 16, 1982

[54] COCKCROFT-WALTON VOLTAGE MULTIPLYING CIRCUIT FOR SLIM HOLE WELL LOGGING TOOL

[75] Inventors: Obie M. Langford; Albert P. Richter, Jr., both of Houston, Tex.

[73] Assignee: Texaco Inc., White Plains, N.Y.

[21] Appl. No.: 146,738

[22] Filed: May 5, 1980

[51] Int. Cl.³ ............................................. H02M 7/10
[52] U.S. Cl. ........................................................ 363/59
[58] Field of Search .............................. 363/59, 60, 61

[56] References Cited

U.S. PATENT DOCUMENTS

| | | | |
|---|---|---|---|
| 2,369,772 | 2/1945 | Bouwers | 363/59 |
| 2,823,347 | 2/1958 | Procter | 363/59 |
| 3,900,788 | 8/1975 | Behn et al. | 363/59 |

FOREIGN PATENT DOCUMENTS 2206097  8/1973  Fed. Rep. of Germany ........ 363/59

Primary Examiner—A. D. Pellinen
Attorney, Agent, or Firm—Carl G. Ries; Robert A. Kulason; Ronald G. Gillespie

[57] ABSTRACT

A Cockcroft-Walton voltage multiplying circuit constructed for use in a slim hole well logging tool includes a plurality of capacitor packages having a first capacitor package, adapted to receive an input voltage, and a last capacitor package. A plurality of high voltage rectifier packages of which each rectifier package, except for a last rectifier package, are physically as well as electrically interconnected with two capacitor packages. The last rectifier package is connected to the last capacitor package so that all of the capacitor packages and all of the rectifier packages form an inline rigid body. Output terminals are connected to the last rectifier package for providing the high voltage developed by the capacitor packages and the rectifier packages in response to a received input voltage.

4 Claims, 6 Drawing Figures

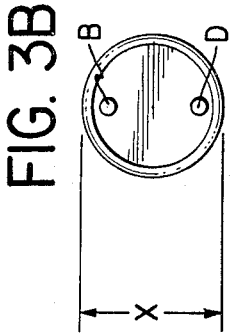
FIG. 3B
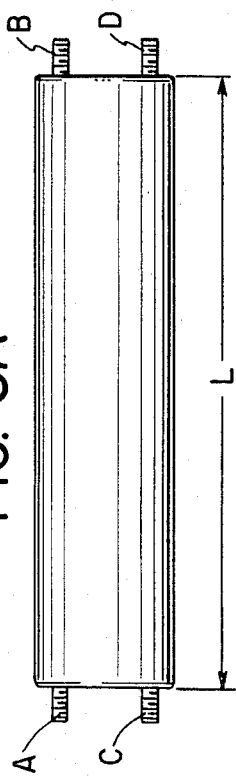
FIG. 3A
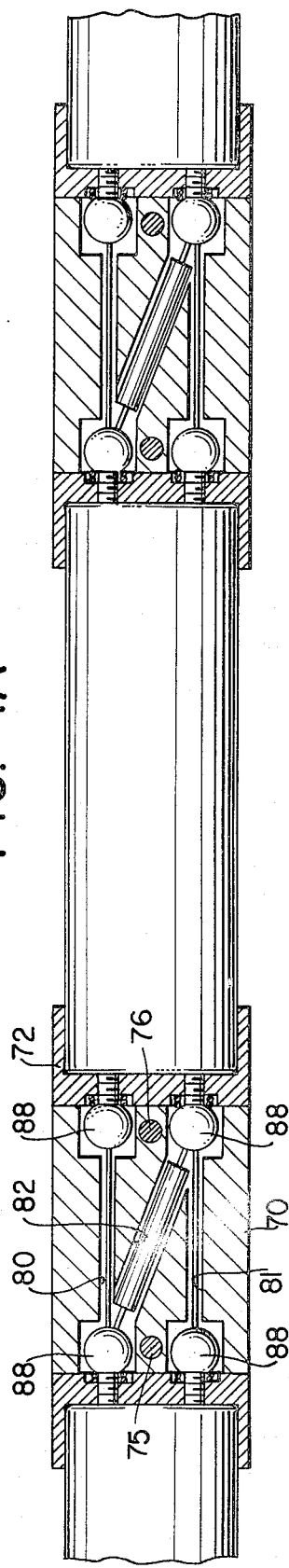
FIG. 4A
FIG. 4B

COCKCROFT-WALTON VOLTAGE MULTIPLYING CIRCUIT FOR SLIM HOLE WELL LOGGING TOOL

BACKGROUND OF THE INVENTION

1. Field of the Invention

The present invention relates to well logging tools in general and, more particularly, to a Cockcroft-Walton voltage multiplying circuit for a well logging tool.

2. Summary of the Invention

A high voltage power supply constructed for use in a slim hole well logging tool includes a plurality of capacitor packages having a first capacitor package, adapted to receive an input voltage, and a last capacitor package. A plurality of high voltage rectifier packages of which each rectifier package, except for a last rectifier package, is connected physically as well as electrically between two capacitor packages. The last rectifier package is connected to the last capacitor package so that all the capacitor packages and rectifier packages form an in-line rigid body. Output terminals are connected to the last rectifier package for providing the high voltage developed by the capacitor packages and the rectifier packages in response to a received input voltage.

DESCRIPTION OF THE DRAWINGS

FIGS. 3A and 3B are views of a capacitor package.

FIGS. 4A and 4B are views of the rectifier packages in relationship to the capacitor packages, shown in FIG. 2.

DESCRIPTION OF THE INVENTION

Due to soaring costs associated with well logging, an urgent need has appeared to do well logging through oil well tubing. This physically restricts the diameter of a logging sonde to a typical size of 1-11/16 inches. In cased hole logging, formation measurements through tubing and casing require a radioactive source such as a neutron generator. The neutron tube is an artificial radioactive source that can be turned on or off and requires an extremely high accelerating voltage of 80 to 125 kv. at 100 microamps load current. The present invention uses a common Cockroft-Walton type voltage multiplying circuit with unique packaging techniques.

Figure 1:
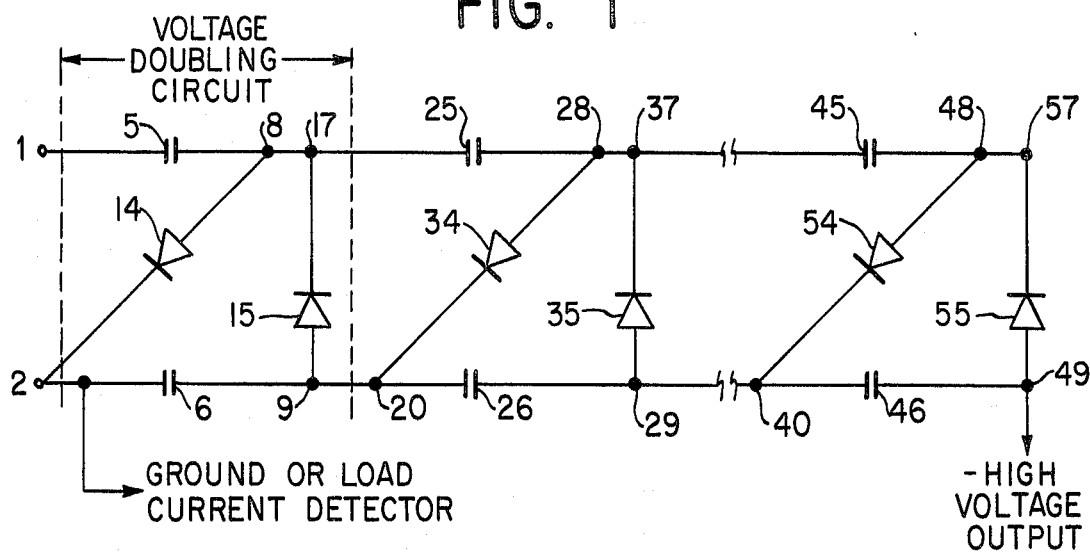
FIG. 1 is an electrical schematic of a Cockroft-Walton voltage multiplying circuit.

Referring to FIG. 1, there is shown an electrical schematic of a common Cockroft-Walton voltage multiplying circuit. Input terminals 1 and 2 receive an energizing voltage and are connected to capacitors 5 and 6, respectively. Connecting point terminology is used for ease of explanation. Capacitors 5, 6 are connected to connecting points 8 and 9, respectively, which in turn are connected to high voltage rectifiers 14 and 15, respectively. Rectifier 14 is also connected to input 2, while rectifier 15 is connected to a connecting point 17. Capacitors 5, 6 and high voltage rectifiers 14, 15 form a voltage doubling circuit. The voltage multiplying circuit is made up of any number of voltage doubling circuits depending on the output voltage desired.

Connecting point 9 is connected to a connecting point 20. Connecting points 17, 20 are connected to capacitors 25 and 26, respectively. Capacitors 25, 26 are also connected to connecting points 28 and 29, respectively. Connecting points 28 and 29 are connected to high voltage rectifiers 34 and 35, respectively. Rectifier 35 is also connected to a connecting point 37 while rectifier 34 is connected to connecting point 20. Connecting point 29 is connected to connecting point 40. Connecting points 37, 40 are connected to capacitors 45 and 46, respectively, which in turn are connected to connecting points 48 and 49, respectively. It should be noted that the breaks between connecting point 37 and capacitor 45 and between connecting points 29 and 40 indicate that any number of doubling stages may be inserted within the breaks to change the amplitude of the output voltage. Connecting points 48, 49 are connected to rectifiers 54 and 55, respectively, which in turn are connected to connecting points 40 and 57, respectively. Connecting point 49 is an output terminal for a negative high voltage output, while terminal 2 may be connected to ground or to a load current detector such as described in U.S. Pat. No. 4,092,545. It should be noted at this time that if a positive high voltage is desired, it can be accomplished by connecting the rectifiers so that the polarity is opposite that of present configuration.

Figure 2:
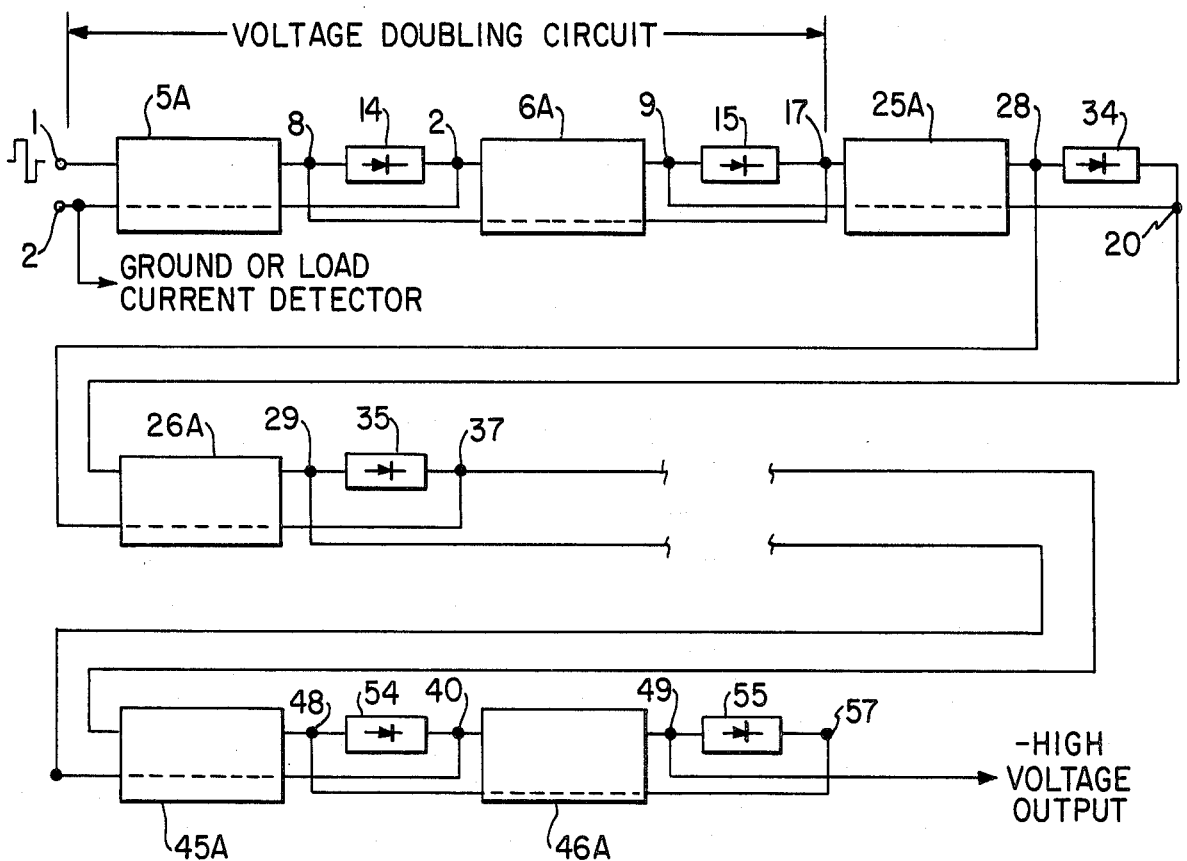
FIg. 2 is a graphical representation of the physical interconnection between the capacitor packages and the rectifier packages of the power supply, constructed in accordance with the present invention.

The physical arrangement of the capacitors and high voltage rectifiers may be connected as shown in FIG. 2, wherein terminals 1 and 2 are connected to a capacitor terminal and a feed through terminal of a capacitor package 5A. Capacitor package 5A will be described in more detail hereinafter. It is sufficient at this point to say that capacitor package 5A contains capacitor 5 connected between capacitor terminals and a feed through conductor indicated by the dash line passing through the package 5A connected between the feed through terminals. Rectifier 14 is connected between point 2 and a feed through terminal of package 5A. It should be noted that a capacitor package contains the capacitor having the same numeric designation as the package. The capacitor terminals of capacitor package 25A are connected to connecting points 17, 28, respectively, while the feed through terminals of capacitor package 25A are connected to connecting points 9 and 20. Rectifier 34 is connected between connecting points 28 and 20, as shown. The capacitor terminals of capacitor package 26A are connected to connecting points 20, 29 while the feed through terminals of capacitor package 26A are connected to connecting points 28 and 37, respectively. Rectifier 35 is connected between connecting points 29 and 37 as shown. Similarly, the capacitor terminals of capacitor package 45A are connected to connecting points 37 and 48, respectively. Again the breaks in the lines indicate that additional doubling circuits may be inserted as necessary. Connecting point 40 is connected to connecting point 29 by the through conductor in capacitor package 45A. Rectifier 54 is connected between connecting points 40, 48 as shown. The capacitor terminals of capacitor package 46A are connected to connecting points 40 and 49, respectively, while the feed through terminals in capacitor package 46A are connected to connecting points 48 and 57, respectively. Rectifier 55 is connected between connecting points 49 and 57, as shown.

Referring now to FIGS. 3A and 3B, there is shown a capacitor package having capacitor terminals A and B and feed through terminals C and D. terminals A, B are connected by an internal capacitor. Terminals C and D are connected by a conductor in the capacitor package. As can be seen, the capacitor package is a cylindrical package having a diameter X and a length L. The cylindrical package is ideal to reduce the probability of high voltage breakdown by forming a uniform electric field within the bore of a logging sonde. The capacitor is packaged axially within an epoxy cylinder with the capacitor terminal A and capacitor terminal B on opposite ends. The high voltage feed through conductor is a wire that runs axially through the package and must be insulated to the maximum voltage rate of the capacitor. The cylindrical package is part of the composite strength member of the power supply. A typical diameter for X for slim hole well logging sonde is 1 to 1¼ inches. The length L will vary as a function of the capacitance and the voltage rating; a typical length ia 4–6 inches.

Referring now to FIGS. 4A and 4B, the capacitor packages are interconnected with an interconnecting modules 70. Each interconnecting module 70 includes a non-conductive plastic cap 73 and a non-conductive plastic body 72. Body 72 is made so that the terminals of a capacitor package passes through the ends of body 72. Body 72 has two threaded holes 75 and 76 used as hereinafter explained and three slots 80, 81, 82. Slots 80 and 81 are utilized for housing conductors connected to the terminals of the capacitor packages, while slot 82 is for housing one high voltage rectifier. The conductor and rectifier are connected to terminals with spherical high voltage terminations 88 that tend to minimize the high electric field at each connection. Terminations 88 are approximately one-fourth or three-eighths inches in diameter and screw onto the terminals of the capacitor packages.

With the conductors and rectifiers connected to the terminals of the capacitor packages, cap 73 interlocks mechanically with the body 72 of the module and is held together by two non-conductive screws which screw into threaded holes 75 and 76. The assembled module 70 serves as a centralized, bearing surface and then part of the composite strength member for the voltage multiplying circuit.

The present invention as hereinbefore described features a unique capacitor package that contains a parallel in-line packaging of a high voltage capacitor and a high voltage feed through conductor in a common package. The present invention also includes interconnecting non-conductive plastic modules between capacitor packages that houses high voltage rectifiers and an associated interconnecting wire, four high voltage terminations per module and acts as a mechanical bearing and support member.

What is claimed is:

1. A Cockcroft-Walton voltage multiplying circuit adapted for use in a slim hole well logging tool comprising a plurality of capacitor means including a first capacitor means, adapted to receive an input voltage, and a last capacitor means; a plurality of high voltage rectifier means, each rectifier means, except for a last rectifier means, physically as well as electrically interconnect two capacitor means and the last rectifier means being connected to the last capacitor means so that all the capacitor means and rectifier means form an in-line rigid body, and each rectifier means includes a non-conductive plastic body having two ends, adapted to fit over ends of the capacitor means with clearance holes for the capacitor means terminals, three channels and two threaded holes; a non-conductive plastic cap which fits between the ends of the plastic body having two counter sunk clearance holes which align with the receivers of the body, and two screws for securing the cap to the body when threaded into the threaded holes; and output means connected to the last rectifier means for providing a high voltage developed by the capacitor means and the rectifier means.

2. A Cockcroft-Walton voltage multiplying circuit adapted for use in a slim hole well logging tool comprising a plurality of high voltage rectifier means including a first rectifier means, adapted to receive an input voltage, and a last rectifier means; a plurality of capacitor means, each capacitor means, except for a last capacitor means physically as well as electrically interconnect two rectifier means, and the last capacitor means being connected to the last rectifier means so that all the capacitor means and rectifier means form an in-line rigid body, and each rectifier means includes a non-conductive plastic body having two ends, adapted to fit over ends of the capacitor means with clearance holes for the capacitor means terminals, three channels and two threaded holes; a non-conductive plastic cap which fits between the ends of the plastic body having two counter sunk clearance holes which align with the receivers of the body, and two screws for securing the cap to the body when threaded into the threaded holes; and output means connected to the last capacitor means for providing a high voltage developed by the capacitor means and the rectifier means.

3. A voltage multiplying circuit as described in claim 1 or 2 in which the capacitor means is cylindrical in shape and has two high voltage threaded terminals at each end, a high voltage capacitor connected between one terminal at one end and one terminal at the other end, and a conductor connecting the other terminal at the one end to the other terminal at the other end.

4. A voltage multiplying circuit as described in claim 3 in which each rectifier means includes a high voltage rectifier arranged in one channel of the body, two conductors arranged in the two remaining channels of the body, and four spherical terminating means for connecting the rectifier and the conductors to the capacitor means terminals.

* * * * *